United States Patent
Singer et al.

(10) Patent No.: US 8,426,875 B2
(45) Date of Patent: Apr. 23, 2013

(54) ARRANGEMENT HAVING AT LEAST TWO LIGHT-EMITTING SEMICONDUCTOR COMPONENTS AND METHOD FOR THE PRODUCTION OF SUCH AN ARRANGEMENT

(75) Inventors: Frank Singer, Regenstauf (DE); Thomas Zeiler, Nittendorf (DE); Joachim Reill, Zeitlarn (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 134 days.

(21) Appl. No.: 12/745,249

(22) PCT Filed: Nov. 18, 2008

(86) PCT No.: PCT/DE2008/001902
§ 371 (c)(1), (2), (4) Date: Nov. 23, 2010

(87) PCT Pub. No.: WO2009/067989
PCT Pub. Date: Jun. 4, 2009

(65) Prior Publication Data
US 2011/0186867 A1    Aug. 4, 2011

(30) Foreign Application Priority Data

Nov. 27, 2007 (DE) .......................... 10 2007 056 925
Feb. 26, 2008 (DE) .......................... 10 2008 011 153

(51) Int. Cl.
*H01L 31/048* (2006.01)

(52) U.S. Cl.
USPC ............ 257/88; 257/89; 257/91; 257/E27.07; 257/E33.061; 438/28

(58) Field of Classification Search ................... 257/88, 257/89, 91, E27.07, E33.61; 438/28
See application file for complete search history.

(56) References Cited

U.S. PATENT DOCUMENTS

| | | | |
|---|---|---|---|
| 7,055,987 B2 * | 6/2006 | Staufert | 362/235 |
| 7,737,623 B2 * | 6/2010 | Kaneda et al. | 313/503 |
| 7,947,894 B2 * | 5/2011 | Nakata | 136/250 |
| 2003/0160256 A1 | 8/2003 | Durocher et al. | |
| 2006/0001055 A1 | 1/2006 | Ueno et al. | |
| 2006/0083281 A1 | 4/2006 | Inoguchi | |
| 2006/0139915 A1 | 6/2006 | Chiaretti | |
| 2006/0197098 A1 | 9/2006 | Aihara | |
| 2007/0166853 A1 | 7/2007 | Guenther et al. | |

(Continued)

FOREIGN PATENT DOCUMENTS

| | | |
|---|---|---|
| EP | 1 780 592 | 6/2005 |
| JP | 2002-211030 | 7/2002 |

(Continued)

*Primary Examiner* — Allan R Wilson
(74) *Attorney, Agent, or Firm* — Cozen O'Connor (57) ABSTRACT

An arrangement having at least two light-emitting semiconductor components (101, 111) arranged adjacent to one another has envelopes (102, 112) at least partly surrounding the at least two light-emitting semiconductor components in each case. The envelopes contain a converter substance, which partly or completely converts the wavelength range of the radiation emitted by the semiconductor components. At least one optical damping element (103) is arranged between the at least two light-emitting semiconductor components, which optically isolates the respective envelopes of the semiconductor components in order to reduce a coupling-in from at least one envelope (102) into at least one other of the envelopes (112), or from at least one semiconductor component (101) into the envelope (112) of at least one of the other semiconductor components (111).

20 Claims, 6 Drawing Sheets

U.S. PATENT DOCUMENTS

| | | |
|---|---|---|
| 2007/0176197 A1 | 8/2007 | Shiraishi et al. |
| 2008/0053691 A1* | 3/2008 | Kurihara .................. 174/260 |
| 2008/0237612 A1* | 10/2008 | Cok ........................... 257/88 |
| 2009/0072250 A1* | 3/2009 | Inoue ......................... 257/88 |
| 2009/0114929 A1* | 5/2009 | Lee et al. ................... 257/88 |
| 2009/0303694 A1* | 12/2009 | Roth et al. ................. 362/84 |

FOREIGN PATENT DOCUMENTS

| | | |
|---|---|---|
| JP | 2004-303503 | 10/2004 |
| JP | 2005-187367 | 7/2005 |
| JP | 2006-114854 | 4/2006 |
| JP | 2007-005735 | 1/2007 |
| JP | 2007-129188 | 5/2007 |
| JP | 2007-201361 | 8/2007 |
| WO | WO 2006/064996 | 6/2006 |
| WO | WO 2006/098561 | 9/2006 |
| WO | WO 2006/129278 | 12/2006 |
| WO | WO 2007/114614 | 10/2007 |

* cited by examiner

ARRANGEMENT HAVING AT LEAST TWO LIGHT-EMITTING SEMICONDUCTOR COMPONENTS AND METHOD FOR THE PRODUCTION OF SUCH AN ARRANGEMENT

RELATED APPLICATION

This is a U.S. National Phase Application under 35 USC §371 of International Application PCT/DE2008/001902 filed on Nov. 18, 2008.

This patent application claims the priorities of German Patent Application 10 2007 056 925.6 filed Nov. 27, 2007 and of German Patent Application 10 2008 011 153.8 filed Feb. 26, 2008, the entire disclosure contents of which are hereby incorporated by reference in the present patent application.

FIELD OF THE INVENTION

The invention relates to an arrangement having at least two light-emitting semiconductor components and to a method for producing an arrangement having at least two light-emitting semiconductor components.

BACKGROUND OF THE INVENTION

In order to generate white light with the aid of light-emitting semiconductor components, the light-emitting semiconductor components are provided with an envelope containing a converter substance. Said converter substance converts the radiation in a first wavelength range (primary radiation) that is emitted by the semiconductor component into radiation in a second wavelength range (secondary radiation), which differs from the first range. White light may be generated in this way either by primary radiation being mixed with the secondary radiation, or by the color components of the converted radiation mixed together producing white light.

If a plurality of light-emitting semiconductor components with a converter envelope are arranged adjacent to one another, the radiation of adjacent light-emitting components may result in excitation of the converter substance of semiconductor components to which no voltage is applied. This concomitant luminescence has the effect that applications which require a precise separation between light and dark regions may be realized only with a high outlay.

SUMMARY OF THE INVENTION

It is an object of the invention to specify an arrangement having at least two light-emitting semiconductor components and also a method for producing an arrangement having at least two light-emitting semiconductor components which may be produced more simply and more cost-effectively.

An arrangement having at least two light-emitting semiconductor components arranged adjacent to one another has envelopes at least partly surrounding the at least two light-emitting semiconductor components in each case. The envelopes contain a converter substance, which partly or completely converts the wavelength range of the radiation emitted by the semiconductor components. The arrangement has at least one optical damping element, which is arranged between the at least two light-emitting semiconductor components. The damping element optically isolates the respective envelopes in order to reduce an optical coupling-in of a radiation emitted by at least one of the semiconductor components into the envelope of at least one of the other semiconductor components. The damping element may also reduce the optical coupling-in of a radiation emitted by at least one of the envelopes into at least one other of the envelopes.

In one embodiment, the damping element is formed as an elevation of a carrier element for the at least two light-emitting semiconductor components. By way of example, the carrier element and the damping element are formed from one piece, for example from a ceramic.

The damping element, in order to reduce passage of radiation through the elevation, may be coated with a light-opaque material, for example galvanically with a metal layer. The elevation of the carrier element extends at least as far as the level of the envelope in order to optically isolate the latter.

In a further embodiment, the damping element is formed as a body composed of a potting material, which body surrounds the at least two semiconductor components and the respective envelopes and optically isolates the envelopes. The damping element may be a body composed of a plastic, which body surrounds the at least two semiconductor components and the respective envelopes and optically isolates the envelopes.

The optical damping element may be formed as part of a light-transmissive covering arranged above the semiconductor components in order to protect the semiconductor components. In one embodiment, a silicon strip which is so high that it optically isolates the envelopes is connected to the covering, for example by means of an anodic bonding connection. In a further embodiment, a body composed of an injection-molded plastic is connected to the covering, for example is adhesively bonded or printed onto the covering. The damping element may be a shaped portion of the covering, which is formed with the covering from one piece. Said shaped portion is provided with a light-opaque coating, which contains chromium, for example.

In a method for producing an arrangement having at least two light-emitting semiconductor components arranged adjacent to one another, envelopes at least partly surrounding the two light-emitting semiconductor components in each case are provided. The envelopes contain a converter substance, which partly or completely converts the wavelength range of the radiation emitted by the semiconductor components. At least one optical damping element is introduced between the two light-emitting semiconductor components. The damping element optically isolates the respective envelopes in order to reduce an optical coupling-in of a radiation emitted by at least one of the semiconductor components into the envelope of at least one of the other semiconductor components. The damping element may also reduce the optical coupling-in of a radiation emitted by at least one of the envelopes into at least one other of the envelopes.

The method may comprise applying the light-emitting semiconductor components to a carrier element and arranging the damping element between the semiconductor components. The damping element is so high that it optically isolates the envelopes and has a form enabling the at least two semiconductor components to be positioned with a small distance with respect to one another.

In one embodiment, the optical damping element and the carrier element are formed as one piece and both are produced from the same material. In a further embodiment, the method comprises screen printing of a potting material between the at least two light-emitting semiconductor components. The method may comprise encapsulating the light-emitting semiconductor components with a plastic by injection molding, such that the plastic optically isolates the envelope.

The method may comprise providing a light-transmissive covering for protecting the at least two semiconductor components, forming at least one optical damping element at the covering, and arranging the covering such that the at least one optical damping element lies between the at least two light-emitting semiconductor components. By way of example, the optical damping element is connected to the covering by anodic bonding. The method may comprise etching the carrier element from a silicon layer connected to the covering. The optical damping element may be adhesively bonded or printed onto the covering. In a further embodiment, the covering is embossed with at least one formation, and said formation is coated with a light-opaque material.

DETAILED DESCRIPTION OF THE DRAWINGS

Figure 1:
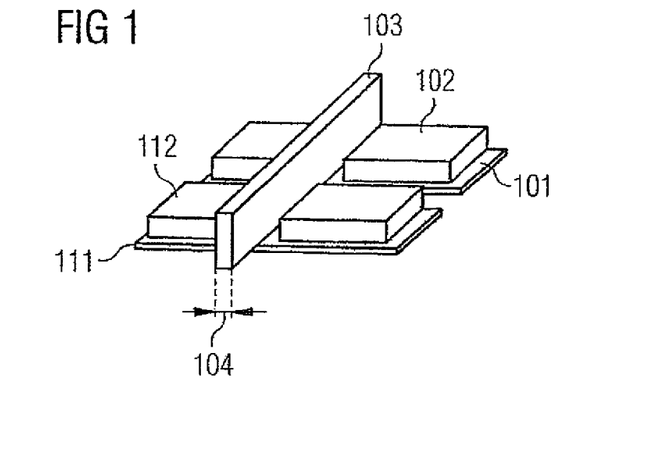
FIG. 1 shows a schematic illustration of an arrangement in accordance with one embodiment.

FIG. 1 shows light-emitting semiconductor components 101 and 111, envelopes of the light-emitting semiconductor components, which form fluorescence converter layers 102 and 112, and an optical damping element 103. When a voltage is applied, the semiconductor components emit radiation in a specific wavelength range. The envelopes contain a converter material, which, when it is excited by electromagnetic radiation in a specific wavelength range, emits radiations having specific wavelengths. The converter material may contain at least one phosphor. By way of example, inorganic or organic phosphors are suitable as the phosphor.

The wavelength ranges of the exciting radiation and of the emitted radiation differ. The envelope may either convert the entire radiation impinging on it, or else convert only a portion of the impinging radiation and transmit the remaining portion, without significantly influencing the wavelength range of the transmitted radiation.

The damping element serves for optically isolating the envelopes or the envelopes and the semiconductor components. It is as opaque as possible to the wavelength ranges emitted by the semiconductor components and the envelopes.

In the exemplary embodiment shown, the damping element is arranged between two rows of semiconductor components with respective envelopes and prevents to the greatest possible extent the emitted radiation of adjacently arranged semiconductor components and/or the converter layers thereof from exciting converter material in envelopes to whose associated semiconductor components no voltage is applied.

A multiplicity of further damping elements may be arranged between further rows in order to optically isolate the further rows from one another. The damping element may also be formed in lattice-type fashion, such that each semiconductor component with respective envelopes is substantially optically isolated from the remaining adjacent semiconductor components and the envelopes thereof. The damping element may also be formed such that arrays of light-emitting semiconductor components with respective envelopes are isolated from one another.

A width 104 of the damping element is as small as possible in order that the semiconductor components may be arranged close to one another. As a consequence of this, the arrangement has a luminous pattern having a homogeneous impression. A relatively high contrast between semiconductor components which emit radiation and semiconductor components to which no voltage is applied may also be achieved. The contrast value is preferably above 100:1, for example 200:1.

Figure 2:
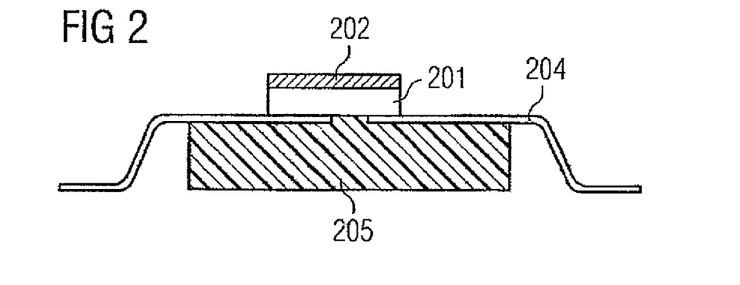
FIG. 2 shows a schematic illustration of a light-emitting semiconductor component.

FIG. 2 shows a schematic illustration of a light-emitting semiconductor component 201, a fluorescence converter layer 202, electrical lines 204 and a carrier element 205. The fluorescence converter layer is arranged on the light-emitting semiconductor component, such that radiation emitted by the semiconductor component may be converted. The semiconductor component is arranged on the carrier element and electrically conductively connected to the lines.

A voltage may be applied to the semiconductor component via the lines. The radiation emitted by the semiconductor component when a voltage is applied is in the blue color range in one embodiment, for example at 445 nm. The converter substance may be excited by the primary radiation emitted by the light-emitting semiconductor component and emits a secondary radiation. In one embodiment, the wavelength range of the secondary radiation is in the yellow color range, that is to say between 560 and 590 nm. In a further embodiment, the converter substance may emit radiation which is in different wavelength ranges, for example in the red (625 to 740 nm) and in the green (520 to 560 nm) color range.

The primary radiation and the secondary radiation have different wavelength ranges. A portion of the primary radiation is transmitted without wavelength conversion by the converter substance. The primary radiation and the secondary radiation are additively mixed. A desired resultant color point, for example white, may be set for example by a setting of a mixing ratio of the primary radiation and secondary radiation. The converter substance may also convert the entire primary radiation. In this case, the secondary radiation consists of radiation having different wavelengths which, mixed together, produce the desired color point.

Radiation in the blue color range mixed with radiation in the yellow color range produces white light. Radiation in the red color range mixed with radiation in the green color range produces yellow light. Radiation in the blue, red and green color ranges produces, when mixed, white light.

The carrier element may serve for dissipating the heat which arises in the light-emitting semiconductor component. For this purpose, it is produced from a material having sufficiently good thermal conductivity, for example a ceramic.

Figure 3:
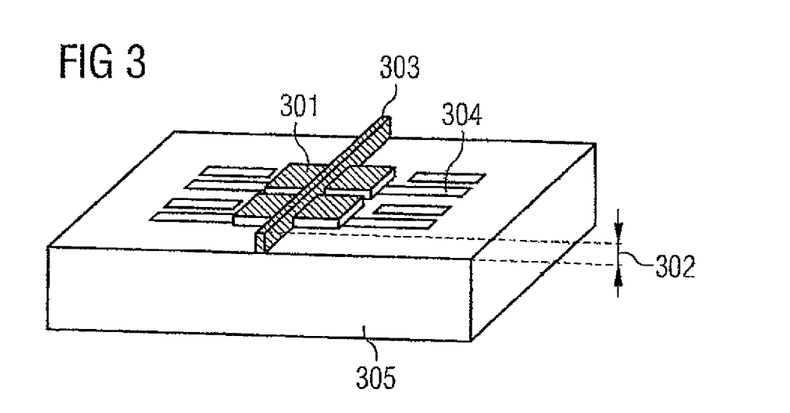
FIG. 3 shows a schematic illustration of a carrier element with a damping element.

FIG. 3 shows light-emitting semiconductor components with envelopes containing fluorescence converter layers 301, an optical damping element 303, electrical lines 304 and a carrier element 305. The semiconductor components are arranged on the carrier element and may be supplied with voltage via the lines. The damping element is formed in one piece with the carrier element. For this purpose, during the production of the carrier element, an elevation of the carrier element is formed at the location between the semiconductor components. In order to achieve the desired narrow grid of the semiconductor components, said elevation is formed such that it is as thin as possible. In order to increase the optical damping effect, the elevation may be coated with a light-opaque material; by way of example, a metal layer may be applied galvanically.

In the embodiment shown, the elevation of the carrier element separates two lines of semiconductor components. However, the damping element may also be formed such that each semiconductor component with a respective envelope is optically isolated from the remaining adjacent semiconductor components and the envelopes thereof. The damping element may also be formed such that specific arrays of semiconductor components are optically isolated from one another. A height 302 of the damping element is at least so high that the light-emitting semiconductor components with the respective envelopes are sufficiently isolated from one another, that is to say that no fluorescence converter layers are unintentionally excited.

Figure 4:
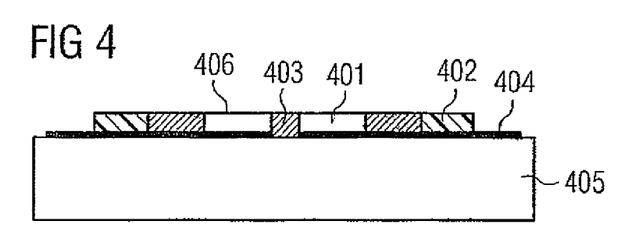
FIG. 4 shows a schematic illustration of an arrangement in accordance with one embodiment with a body composed of potting material.

FIG. 4 shows light-emitting semiconductor components 401 with envelopes, a frame 402, potting material 403, electrical lines 404 and a carrier element 405. The envelopes contain fluorescence converter layers. The semiconductor layers are arranged on the carrier element and may be supplied with a voltage via the lines. The frame is formed around a region in which the semiconductor components are arranged. The frame serves to ensure that regions which are not intended to be covered by the potting material are kept free of the potting material.

The potting material covers the region within the frame to such a height that the light-emitting semiconductor components and the corresponding envelopes with fluorescence converter material are optically isolated, but at most up to a height of a surface 406 of the light-emitting semiconductor components and the envelopes from which radiation is emitted.

In addition to the as far as possible light-opaque potting body, a light-transmissive potting for the protection of the semiconductor components may be applied above the light-emitting semiconductor components and the potting compound on the side of the surface 406. In this case, the frame has to be formed with a height such that the light-transmissive potting material spreads only within the frame and regions which are not intended to be covered by the potting material are kept free of the light-transmissive potting material.

Figure 5:
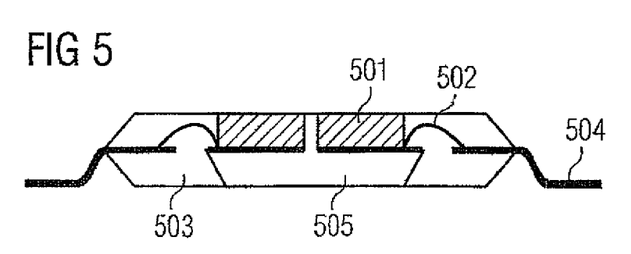
FIG. 5 shows a schematic illustration of an arrangement in accordance with one, embodiment with a plastic body.

FIG. 5 shows light-emitting semiconductor components with envelopes, bonding wires 502, a housing body 503, electrical lines 504 and a carrier element 505. The envelopes contain fluorescence converter layers. The semiconductor components with the fluorescence converter layers are arranged on the carrier element and may be supplied with voltage via the lines and the bonding wires. The housing body is composed of plastic which is as far as possible light-opaque, for example, and surrounds the light-emitting semiconductor components, the fluorescence converter layers, the carrier element and partly the lines. As a result of the formation of the housing body between the light-emitting semiconductor components with respective envelopes, these are optically isolated from one another.

In addition to the optical isolation, the plastic body fulfils a function of a protective body. The housing body serves for example for protecting the lines and the semiconductor components against external influences, and also for simplifying the handling of the arrangement, for example during mounting.

Figure 6:
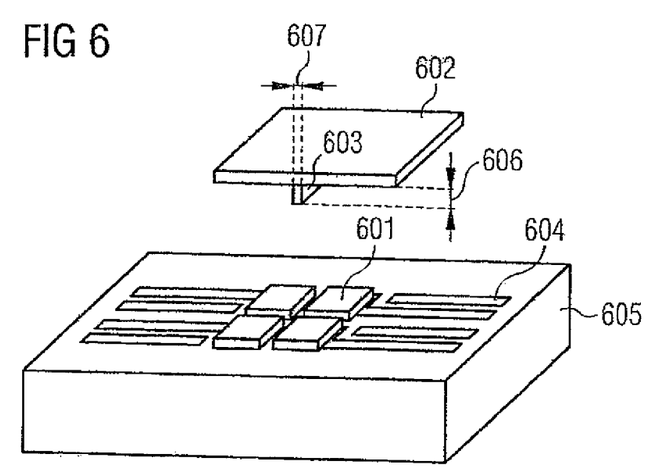
FIG. 6 shows a schematic illustration of a carrier element and of a light-transmissive covering, at which a damping element is arranged.

FIG. 6 shows light-emitting semiconductor components 601 with envelopes, a covering 602, an optical damping element 603, electrical lines 604 and a carrier element 605. The envelopes contain fluorescence converter layers. The semiconductor components are arranged on the carrier element and may be supplied with a voltage via the lines. The covering consists of a light-transmissive material, for example glass, for example BF33 or Pyrex, and serves for protecting the semiconductor components against external influences.

The optical damping element is arranged as part of the covering. The figure does not show the covering in the final position thereof, but rather at a greater distance from the semiconductor components and the carrier element. A height 606 of the damping element is so high that the damping element, when the covering is arranged in its envisaged position, effects an optical isolation of the semiconductor components and the respective envelopes.

In one embodiment, the damping element extends as far as between the envelopes; in a further embodiment, the damping element extends as far as between the envelopes and the light-emitting semiconductor components. The damping element thus reduces an optical coupling-in of a radiation emitted by at least one of the envelopes into at least one other of the envelopes. The damping element may also reduce the optical coupling-in of a radiation emitted by at least one of the semiconductor components into the envelope of at least one of the other semiconductor components.

In the exemplary embodiment shown, two rows of light-emitting semiconductor components with fluorescence converter layers are isolated from one another by the optical damping element. Further optical damping elements may be arranged in order to isolate more than two rows of semiconductor components with respective envelopes from one another.

The damping element may be cuboidal, as in the embodiment shown; the damping element may also have other forms, for example triangular in cross section. The form is formed such that the light-emitting semiconductor components may be arranged as close to one another as possible. A width 607 is for example in a range of 0.05 mm to 0.3 mm; the height is in a range of 0.2 mm to 0.8 mm. The damping element is connected to the covering by an anodic bonding connection, for example, and may consist of silicon in one embodiment.

Figure 7:
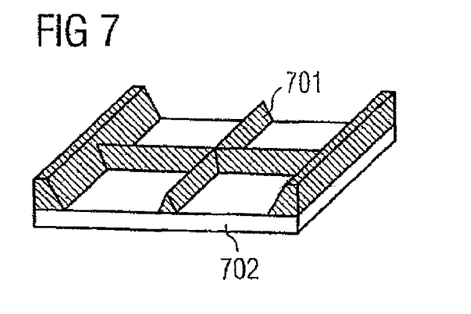
FIG. 7 shows a schematic illustration of a light-transmissive covering, to which a damping element is applied.

FIG. 7 shows a covering 702 with a separating ridge 701. The damping element is formed in lattice-type fashion, such that light-emitting semiconductor components are optically isolated from the adjacent semiconductor components when the covering is arranged in its predefined position for the protection of semiconductor components. The damping element may also be formed such that rows of light-emitting semiconductor components with respective fluorescence converter layers are isolated from one another.

The covering is produced from a light-transmissive material, for example glass. The damping element may be etched from an as far as possible light-opaque coating applied to the covering. By way of example, the as far as possible light-opaque coating is a silicon coating anodically bonded onto the covering, for example. In another embodiment, the damping element is composed of plastic and adhesively bonded or printed onto the covering, for example.

Figure 8:
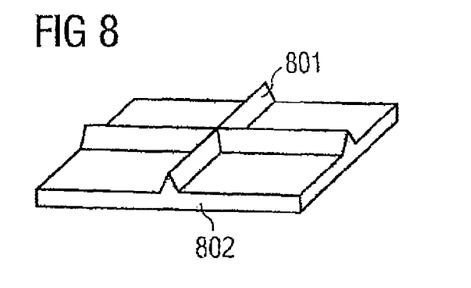
FIG. 8 shows a schematic illustration of a light-transmissive covering, which is embossed together with a shaped portion.

FIG. 8 shows a coated formation 801 of a covering 802. The covering is produced from light-transmissive material. The formation is coated in as far as possible light-opaque fashion, for example with a metal structure. The formation of the covering is so high that it optically isolates the envelopes of the light-emitting semiconductor components when the covering is arranged in its predefined position for the protection of semiconductor components. The damping element is formed in lattice-type fashion, such that light-emitting semiconductor components are optically isolated from the adjacent semiconductor components.

The damping element may also be formed such that rows of light-emitting semiconductor components with respective fluorescence converter layers are isolated from one another.

Figure 9A:
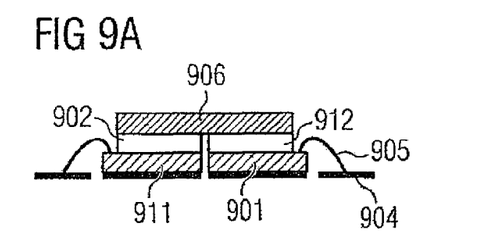
FIGS. 9A to 9D show a schematic illustration of an exemplary embodiment of a method for encapsulating semiconductor components with envelopes by casting.

FIG. 9A shows light-emitting semiconductor components 901 and 911, envelopes with fluorescence converter layers 902 and 912, lines 904, bonding wires 905 and a protective element 906. The semiconductor components with fluorescence converter layers are connected, for example by adhesive bonding or soldering, to a leadframe formed from lines 904. On the—with respect to the leadframe—opposite surface of the light-emitting semiconductor components and the envelopes, a protective element, for example a protective film, is applied, which protects the semiconductor components and the envelopes against damage, for example scratching in the subsequent method steps.

Figure 9B:
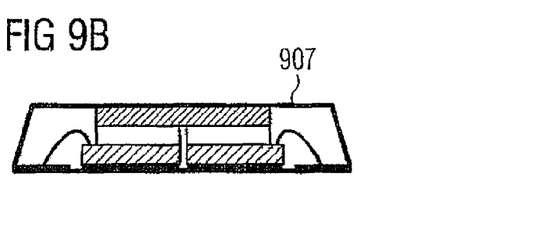

FIG. 9B shows a mold 907, which terminates relatively precisely with the protective element on one side, and with the leadframe on another side. The plastic body which arises in the course of the method may optically isolate the light-emitting semiconductor components and the respective envelopes from one another. An opposite side of the leadframe with respect to the semiconductor components and also that side of the light-emitting semiconductor components from which radiation is emitted are not covered by the potting material.

Figure 9C:
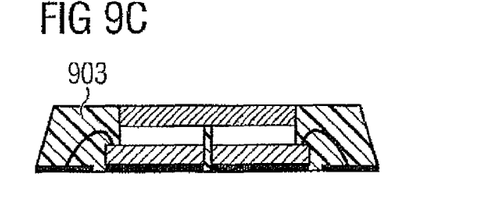

FIG. 9C shows a plastic body 903 surrounding the light-emitting semiconductor components with the respective envelopes. The plastic body has a form that was prescribed for it by the mold, and covers neither the opposite side of the leadframe with respect to the semiconductor components nor that surface of the semiconductor components from which radiation is emitted. The plastic body optically isolates the light-emitting semiconductor components and the respective envelopes from one another.

Figure 9D:
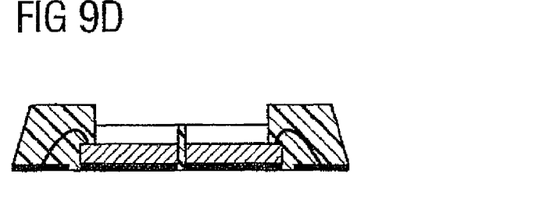

FIG. 9D shows the arrangement after the protective element has been removed. This step may be obviated if the protective element is sufficiently light-transmissive. In this case, the light-transmissive protective element may remain in the arrangement.

Figure 10A:
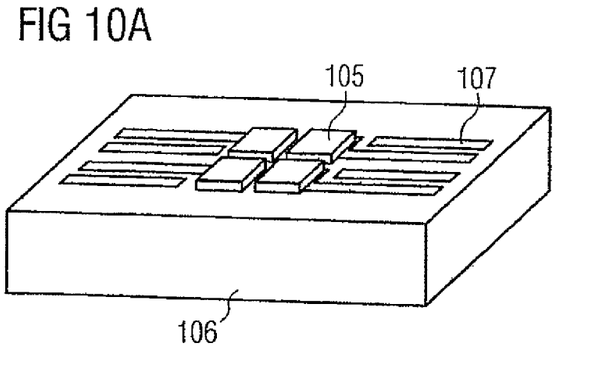
FIGS. 10A to 10C show a schematic illustration of a method in which a damping element is arranged on a carrier element.

FIG. 10A shows light-emitting semiconductor components with fluorescence converter layers 105, a carrier element 106 and electrical lines 107. The light-emitting semiconductor components with the fluorescence converter layers are applied on the carrier element. A voltage may be applied via the lines. In the exemplary embodiment, 2×2 semiconductor components with respective envelopes are arranged. In other embodiments, multiplicities of semiconductor components are arranged on the carrier element, for example an arrangement of 13×66 semiconductor components with respective envelopes.

Figure 10B:
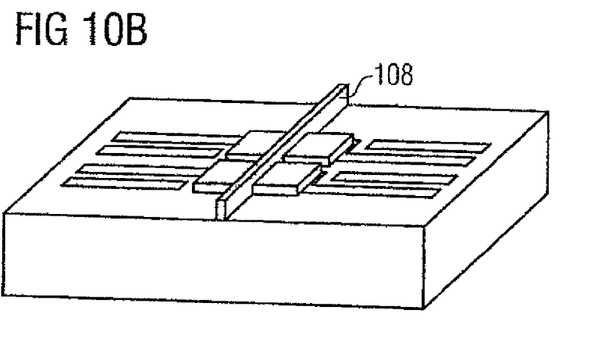

In FIG. 10B, a damping element 108 is arranged between the two rows of light-emitting semiconductor components with fluorescence converter layers. The damping element is so high that it isolates the light-emitting semiconductor components and the respective envelopes from one another. In the embodiment shown, two rows of light-emitting semiconductor components are optically isolated from one another. The damping element may also be formed in lattice-type fashion and optically isolate the semiconductor components from their respective neighbors.

The damping element may be arranged on the carrier element before the carrier element is equipped with the light-emitting semiconductor components. Such a carrier element with damping element is shown in FIG. 10C.

Figure 10C:
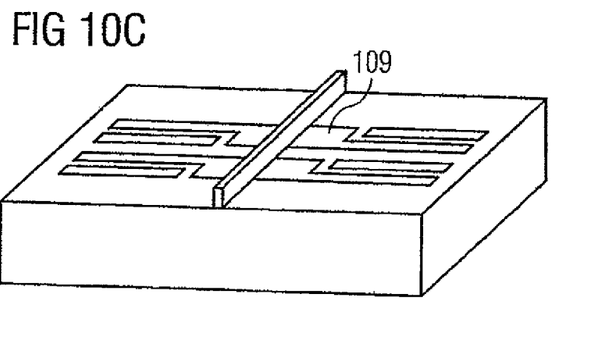

FIG. 10C shows a carrier element with lines and chip connection pads 109. The damping element is arranged between the chip connection pads. When semiconductor components are applied to the carrier element, this leads to an arrangement as shown in FIG. 10B. The carrier element and the damping element may be formed as one piece, for example from ceramic and thereupon be equipped with semiconductor components.

Figure 11A:
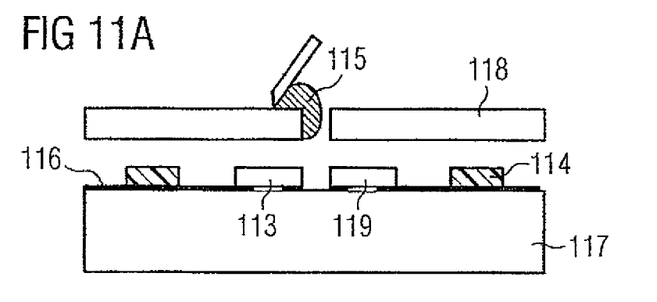
FIGS. 11A and 11B show a schematic illustration of an exemplary embodiment of a screen printing method.

FIG. 11A shows light-emitting semiconductor components with fluorescence converter layers 113, a frame 114, potting material 115, electrical lines 116, a carrier element 117 and a stencil 118. The semiconductor components are arranged on the carrier element and may be supplied with voltage via the lines. The frame is arranged on the carrier element such that it surrounds a region which is intended to be filled with the potting material.

The potting material is printed onto the carrier element by means of screen printing via the screen. The screen has holes where potting material is intended to be printed on. The potting material spreads further after printing on the carrier element until it is cured. The frame limits the spreading of the potting material. The potting material is intended not to cover a surface 119 of the semiconductor components from which radiation is emitted. Through the screen arranged above the carrier element, the amount of potting compound printed is such that the latter is high enough on the carrier element to optically isolate the semiconductor components with the fluorescence converter layers, but does not cover the surfaces 119.

Figure 11B:
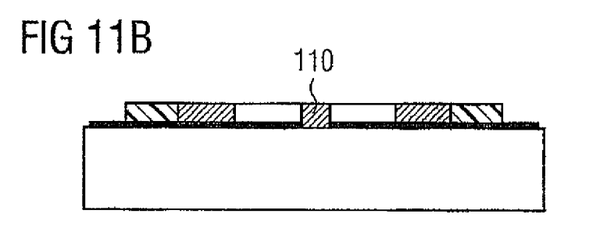

FIG. 11B shows the arrangement with a potting body 110 composed of the potting material 115, the carrier element and the semiconductor components with envelopes. The potting body has been printed onto the arrangement. Only the surfaces 119 of the semiconductor components with fluorescence converter layers from which radiation emerges remain free. The other areas are surrounded by the potting material. The frame defines which regions on the carrier element are covered with potting compound.

A plurality of frames may be arranged on the carrier element in order to be able to form a plurality of potting bodies on the carrier element. The frames each enclose a region in which the potting body is formed for the optical isolation of the light-emitting semiconductor components with fluorescence converter layers that are arranged in the region.

Figure 12A:
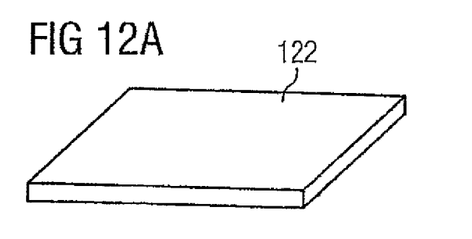
FIGS. 12A to 12C show a schematic illustration of an exemplary embodiment of a method in which the optical damping element is arranged on a light-transmissive covering.

FIG. 12A shows a light-transmissive covering 122. The covering serves for protecting an arrangement of semiconductor components with fluorescence converter layers against external influences. It is light-transmissive, therefore absorbs and reflects as little radiation as possible in the wavelength ranges in which the semiconductor components and the fluorescence converter layers emit.

In one embodiment, the ranges of the radiation emitted by the arrangement are in the visible range, between approximately 380 nm and 780 nm. However, the covering may also be light-transmissive to radiation in the infrared range (780 nm to 1 mm) or in the ultraviolet range (1 nm to 380 nm). The covering may fulfill optical functions; by way of example, it may be formed as a lens or contain regions which act as lenses.

Figure 12B:
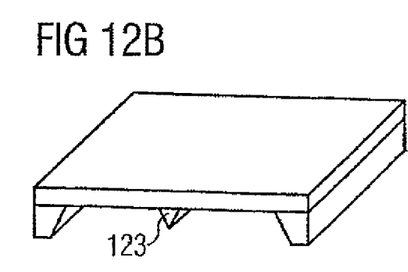

FIG. 12B shows damping elements 123. The latter are as far as possible light-opaque and arranged at those locations of the covering at which optical isolation of light-emitting semiconductor components which are intended to be covered by the covering is provided. The damping elements are formed such that the semiconductor components to be covered may be arranged as close as possible to one another.

The damping elements may be connected to the covering by anodic bonding, for example; the damping elements are anodically bonded silicon strips, for example. In another embodiment, the damping elements are adhesively bonded onto the covering; in a further embodiment, the damping elements are printed onto the covering.

In a further embodiment, the damping elements have been formed during the embossing of the covering as a formation of the covering. These formations are coated with a light-opaque material, for example galvanically with a metal structure.

Figure 12C:
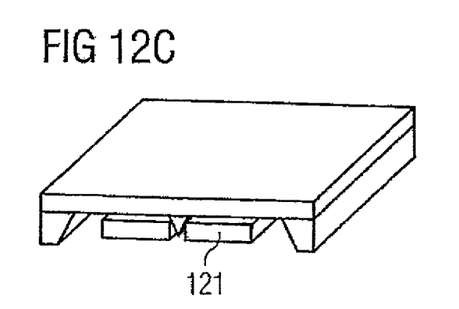

FIG. 12C shows light-emitting semiconductor components with fluorescence converter layers 121 which are covered by a covering with damping elements. The covering is arranged above the semiconductor components with fluorescence converter layers such that the damping elements lie between them and optically isolate them from adjacently arranged semiconductor components and fluorescence converter layers.

Figure 13A:
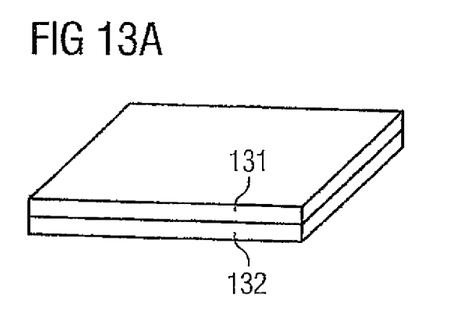
FIGS. 13A to 13C show a schematic illustration of an exemplary embodiment of an etching method.

FIG. 13A shows a light-transmissive covering 132 and an as far as possible light-opaque layer 131. The covering is connected to the layer. The covering is formed from glass, for example. The layer is a silicon layer, for example, which is anodically bonded onto the covering.

Figure 13B:
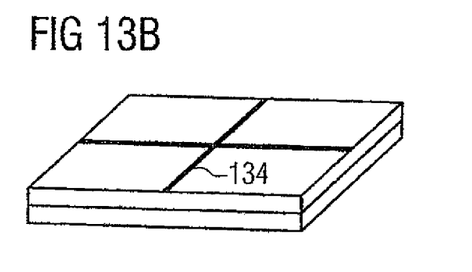

FIG. 13B shows an etching mask 134. The etching mask serves for through hole etching and is formed such that, after an etching process, damping elements remain at those locations of the glass covering at which semiconductor components with fluorescence converter layers are intended to be optically isolated from one another.

The etching mask consists for example of silicon oxide (SiO) or silicon nitride (SiN). By virtue of a relatively narrow mask structure and an occurring under-etching of the mask, that is to say penetration of the etching material under the mask, wedge-shaped damping elements may be formed. The latter form an angle of 54.7°, for example. The etching material is for example potassium hydroxide (KOH) or ethylenediamine pyrocatechol (EDP). Those regions of the covering at which the radiation of the semiconductor components is intended to pass through the covering as far as possible without being impeded have been freed of the light-opaque layer by the etching.

Figure 13C:
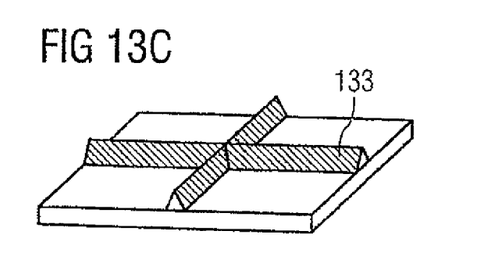

FIG. 13C shows the covering with a damping element 133 after the etching process. The damping elements are formed in a wedge-shaped fashion at the locations at which optical isolation of semiconductor components which are intended to be covered by the covering is desired. They are high enough to extend between the envelopes of the semiconductor components and the semiconductor components. They have a form that enables closely adjacent arrangement of the semiconductor components to be covered.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An arrangement having at least two light-emitting semiconductor components arranged adjacent to one another, comprising:
   wherein said first envelope at least partly surrounds a first semiconductor component of the at least two light-emitting semiconductor components, and wherein said second envelope at least partly surrounds a second semiconductor component of the at least two light-emitting semiconductor components, said envelopes containing a converter substance for the partial or complete wavelength conversion of the radiation emitted by the at least two light-emitting semiconductor components; and
   at least one optical damping element, which is arranged between the at least two light-emitting semiconductor components and optically isolates the respective envelopes in order to reduce an optical coupling-in of a radiation emitted by at least one of the semiconductor components into the envelope of at least one of the other semiconductor components, or the optical coupling-in of a radiation emitted by at least one of the envelopes into at least one other of the envelopes.

2. The arrangement as claimed in claim 1, comprising a carrier element, which carries the at least two semiconductor components, wherein the carrier element and the at least one optical damping element are formed from one piece.

3. The arrangement as claimed in claim 2, comprising at least one elevation of the carrier element which is arranged between the at least two semiconductor components, extends as far as the level of the envelope and optically isolates the envelopes.

4. The arrangement as claimed in claim 1, comprising a body composed of a potting material, which body surrounds the at least two semiconductor components and the respective envelopes and optically isolates the envelopes.

5. The arrangement as claimed in claim 1, comprising a body composed of a plastic, which body surrounds the at least two semiconductor components and the respective envelopes and optically isolates the envelopes.

6. The arrangement as claimed in claim 1, comprising a light-transmissive covering for protecting the at least two semiconductor components, which covering has at least one formation which optically isolates the envelopes.

7. The arrangement as claimed in claim 6, comprising at least one silicon strip which is so high that it optically isolates the envelopes.

8. The arrangement as claimed in claim 7, comprising an anodic bonding connection which connects the at least one silicon strip and the covering.

9. The arrangement as claimed in claim 6, comprising at least one shaped portion of the covering, which is formed with the covering from one piece, is provided with a light-opaque coating and is so high that it optically isolates the envelopes.

10. The arrangement as claimed in claim 9, wherein the light-opaque coating contains chromium.

11. A method for producing an arrangement having at least two light-emitting semiconductor components arranged adjacent to one another, comprising:
   providing said first envelope at least partly surrounds a first semiconductor component of the at least two light-emitting semiconductor components, and providing said second envelope at least partly surrounds a second semiconductor component of the at least two light-emitting semiconductor components, said envelopes containing a converter substance for the partial or complete wavelength conversion of the radiation emitted by the at least two light-emitting semiconductor components; and introducing at least one optical damping element between the at least two light-emitting semiconductor components, which optically isolates the respective envelopes in order to reduce an optical coupling-in of a radiation emitted by at least one of the semiconductor components into the envelope of at least one of the other semiconductor components, or the optical coupling-in of a radiation emitted by at least one of the envelopes into at least one other of the envelopes.

12. The method as claimed in claim 11, comprising:
applying the at least two light-emitting semiconductor components to a carrier element; and
arranging the at least one optical damping element on the carrier element between the at least two semiconductor components,
wherein the at least one optical damping element is so high that it optically isolates the envelopes and has a form that enables the at least two semiconductor components to be positioned with a small distance.

13. The method as claimed in claim 11, comprising:
arranging the at least one optical damping element on the carrier element between at least two connection pads for semiconductor components; and
applying the at least two light-emitting semiconductor components on the connection pads, wherein the at least one optical damping element is so high that it optically isolates the envelopes and has a form that enables the at least two semiconductor components to be positioned with a small distance.

14. The method as claimed in claim 11, comprising screen printing of a potting material between the at least two light-emitting semiconductor components for the formation of at least one body, so high that the envelopes are optically isolated.

15. The method as claimed in claim 11, comprising:
providing a light-transmissive covering for the at least two semiconductor components;
forming at least one optical damping element at the covering, so high that it optically isolates the envelopes; and
arranging the covering such that the at least one optical damping element lies between the at least two light-emitting semiconductor components in order to optically isolate the respective envelopes.

16. The method as claimed in claim 15, comprising:
applying a light-opaque layer onto the light-transmissive covering; and
forming the at least one optical damping element by an etching process with an etching mask and an etching material;
wherein regions of the light-transmissive covering are freed of the light-opaque layer by etching.

17. An arrangement having at least two light-emitting semiconductor components arranged adjacent to one another, comprising:
wherein said first envelope at least partly surrounds a first semiconductor component of the at least two light-emitting semiconductor components, and wherein said second envelope at least partly surrounds a second semiconductor component of the at least two light-emitting semiconductor components, said envelopes containing a converter substance for the partial or complete wavelength conversion of the radiation emitted by the at least two light-emitting semiconductor components;
at least one optical damping element, which is arranged between the at least two light-emitting semiconductor components and optically isolates the respective envelopes in order to reduce an optical coupling-in of a radiation emitted by at least one of the semiconductor components into the envelope of at least one of the other semiconductor components, or the optical coupling-in of a radiation emitted by at least one of the envelopes into at least one other of the envelopes; and
a light-transmissive covering for protecting the at least two semiconductor components;
wherein the optical damping element forms part of the light-transmissive covering.

18. The arrangement of claim 17, wherein the at least one damping element is formed in a wedge-shaped manner at locations at which an optical isolation of the semiconductor components is effected.

19. The arrangement of claim 17, wherein the at least one damping element is a shaped portion of the light-transmissive covering, wherein the shaped portion is formed with the light-transmissive covering from one piece of material.

20. The arrangement of claim 17, wherein the at least one damping element is coated with a light-opaque material.

* * * * *